US010692995B2

(12) United States Patent
Zhou et al.

(10) Patent No.: US 10,692,995 B2
(45) Date of Patent: Jun. 23, 2020

(54) INSULATED-GATE BIPOLAR TRANSISTOR STRUCTURE AND METHOD FOR MANUFACTURING THE SAME

(71) Applicant: Ka Kit Wong, Clear water bay (HK)

(72) Inventors: Xianda Zhou, Clear water bay (HK); Ka Kit Wong, Clear water bay (HK); Kin on johnny Sin, Clear water bay (HK)

(73) Assignee: Ka Kit Wong, Clear Water Bay (HK)

( * ) Notice: Subject to any disclaimer, the term of this patent is extended or adjusted under 35 U.S.C. 154(b) by 122 days.

(21) Appl. No.: 15/571,230

(22) PCT Filed: Jun. 29, 2016

(86) PCT No.: PCT/CN2016/087583
§ 371 (c)(1),
(2) Date: Nov. 1, 2017

(87) PCT Pub. No.: WO2018/000223
PCT Pub. Date: Jan. 4, 2018

(65) Prior Publication Data
US 2018/0226500 A1    Aug. 9, 2018

(51) Int. Cl.
*H01L 29/739*    (2006.01)
*H01L 29/66*    (2006.01)
*H01L 29/06*    (2006.01)
*H01L 29/417*    (2006.01)
*H01L 29/10*    (2006.01)

(52) U.S. Cl.
CPC ...... *H01L 29/7393* (2013.01); *H01L 29/0623* (2013.01); *H01L 29/0649* (2013.01); *H01L 29/0653* (2013.01); *H01L 29/0696* (2013.01); *H01L 29/41708* (2013.01); *H01L 29/66333* (2013.01); *H01L 29/7395* (2013.01); *H01L 29/1095* (2013.01)

(58) Field of Classification Search
CPC ............ H01L 29/7393; H01L 29/7395; H01L 29/0696; H01L 29/1095; H01L 29/66325
See application file for complete search history.

(56) References Cited

U.S. PATENT DOCUMENTS

| 2009/0050932 | A1* | 2/2009 | Lu ........................ H01L 21/84 257/139 |
| 2011/0204413 | A1* | 8/2011 | Arai .................... H01L 29/0653 257/133 |

FOREIGN PATENT DOCUMENTS

| CN | 101901830 A | 12/2010 |
| CN | 102254942 A | 11/2011 |
| CN | 102804384 A | 11/2012 |
| CN | 104810282 A | 7/2015 |

(Continued)

OTHER PUBLICATIONS

International Search Report and Written Opinion of PCT/CN2016/087583, dated Mar. 2, 2017, 11 pages.

*Primary Examiner* — Phat X Cao
(74) *Attorney, Agent, or Firm* — Hamre, Schumann, Mueller & Larson, P.C.

(57) ABSTRACT

The present invention provides an insulated-gate bipolar transistor (IGBT) structure and a method for manufacturing the same. The structure is a planar IGBT structure, and is characterized by an ultra-thin channel and buried oxide located below the channel. The structure can provide the theoretically lowest on-state voltage drop.

18 Claims, 7 Drawing Sheets

(56) References Cited

FOREIGN PATENT DOCUMENTS

| CN | 105390536 A | 3/2016 |
|---|---|---|
| JP | 2005135979 A | 5/2005 |

* cited by examiner

INSULATED-GATE BIPOLAR TRANSISTOR STRUCTURE AND METHOD FOR MANUFACTURING THE SAME

FIELD OF THE INVENTION

The present invention relates generally to the structure of a power semiconductor device and the process for manufacturing the same, and specifically, to an insulated-gate bipolar transistor (IGBT).

BACKGROUND OF THE INVENTION

IGBTs are widely used in high-voltage power electronic systems such as variable-frequency drives and inverters. It is desirable that there is a low power loss in the device. Conduction loss of an IGBT is a major component of the power loss, and the conduction loss is characterized by the on-state voltage drop of the device. Therefore, an objective of the present invention is to provide an IGBT having the theoretically lowest on-state voltage drop.

FIG. 1 shows a cross section of an IGBT device 100 as the prior art. The device 100 is a MOS-controlled PNP bipolar junction transistor. The MOS channel includes an n+ emitter region (112), a p-type base region (113), an n− drift region (114), a gate dielectric (130) and a gate electrode (121). The p-type base region (113) is connected to an emitter electrode (120) through a p+ diffusion region (111). The MOS channel controls the on-state and off-state of the device. At the on-state of the device 100, holes are injected from the p+ collector region (116)/n-type buffer region (115) junction at the back surface. In addition, electrons are conducted by means of the MOS channel, and the non-equilibrium electrons and holes form high-concentration plasma in the lightly doped n− drift region (114), so that high conductivity is obtained in the n− drift region (114). However, because of the slightly reverse biased junction of the n− drift region (114) and p-type base region (113), the concentration of electron-hole plasma near the junction is relatively low. FIG. 2 shows the concentration of electron-hole plasma as a function of the distance in the n− drift region (114). As shown in the figure, because of the drift current at the junction of the n− drift region (114) and the p-type base region (113), the concentration of the electron-hole plasma there is almost zero. Because of the reduced concentration, the on-state voltage drop of the device 100 is larger than the on-state voltage drop of a p-i-n diode. If the slightly reverse biased junction of the n− drift region (114) and p-type base region (113) can be removed, the theoretically lowest on-state voltage drop of the device 100 can be the same as the on-state voltage drop of a p-i-n diode. In the device 100, to achieve the theoretically lowest on-state voltage drop, the width of the silicon mesa between trenches needs to be reduced. When the width of the mesa is approximately 20 nm, two adjacent inversion layers will merge. When the p-type base region (113) is completely converted to an n+ inversion layer, the on-state voltage drop of the device can be the same as the on-state voltage drop of a p-i-n diode. However, actually, it is very difficult to fabricate a mesa having a width of approximately 20 nm in the device 100.

SUMMARY

Therefore, an objective of the present invention is to provide an IGBT structure having the theoretically lowest on-state voltage drop and a method for manufacturing the same.

To achieve this and other objectives, the present invention provides an IGBT structure, including: a collector electrode (322) located at the bottom; a p+ collector region (316) located on top of the collector electrode (322); an n-type buffer region (315) located on top of the p+ collector region (316); an n− drift region (314) located on top of the n-type buffer region (315); a p-type floating region (317), where the floating region is partially surrounded by the upper surface of the n− drift region (314); buried oxide (332) located on top of the p-type floating region (317); an ultra-thin p-type base region (313) located on top of the buried oxide (332); a p+ contact region (311) adjacent to the p-type base region (313); an n+ emitter region (312) adjacent to the p-type base region (313) and the p+ contact region (311); an emitter electrode (321) connected to both the n+ emitter region (312) and the p+ contact region (311); a gate dielectric (330), where the gate dielectric (330) covers the p-type base region (313), thereby forming an electron channel from the n+ emitter region (312) to the n− drift region (314); a gate electrode (320) located on top of the gate dielectric (330); and an inter-layer dielectric (ILD) (331) that isolates the gate electrode (320) from the emitter electrode (321).

To achieve this and other objectives, the present invention further provides a method for manufacturing an IGBT structure.

DETAILED DESCRIPTION

The present invention is described by using an n-type channel device as an example. However, in the description below, it should be understood that the present invention is also applicable to a p-type channel device. In the specification of the present invention, a heavily doped n-type region is marked with n+, and a heavily doped p-type region is marked with p+. In silicon, unless otherwise specified, a heavily doped region generally has a doping concentration ranging from $1 \times 10^{19}$ cm$^{-3}$ to $1 \times 10^{21}$ cm$^{-3}$. In the specification of the present invention, a lightly doped n-type region is marked with n−, and a lightly doped p-type region is marked with p−. In silicon, unless otherwise specified, a lightly doped region generally has a doping concentration ranging from $1 \times 10^{13}$ cm$^{-3}$ to $1 \times 10^{17}$ cm$^{-3}$.

Figure 1:
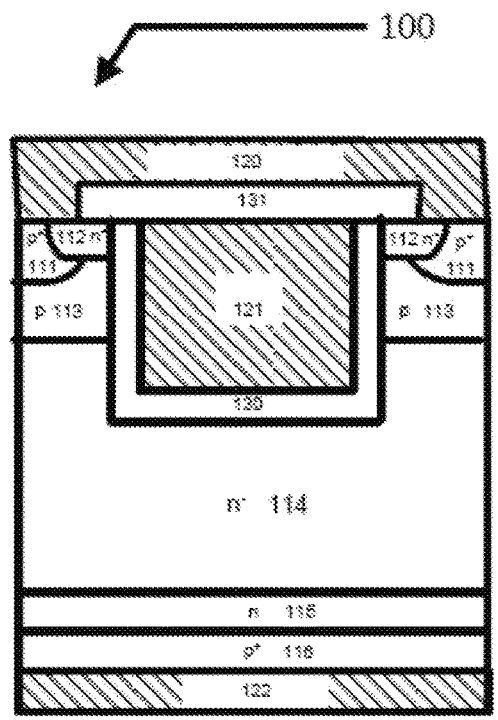
FIG. 1 is a cross-sectional view of an IGBT device 100 as the prior art.
Figure 2:
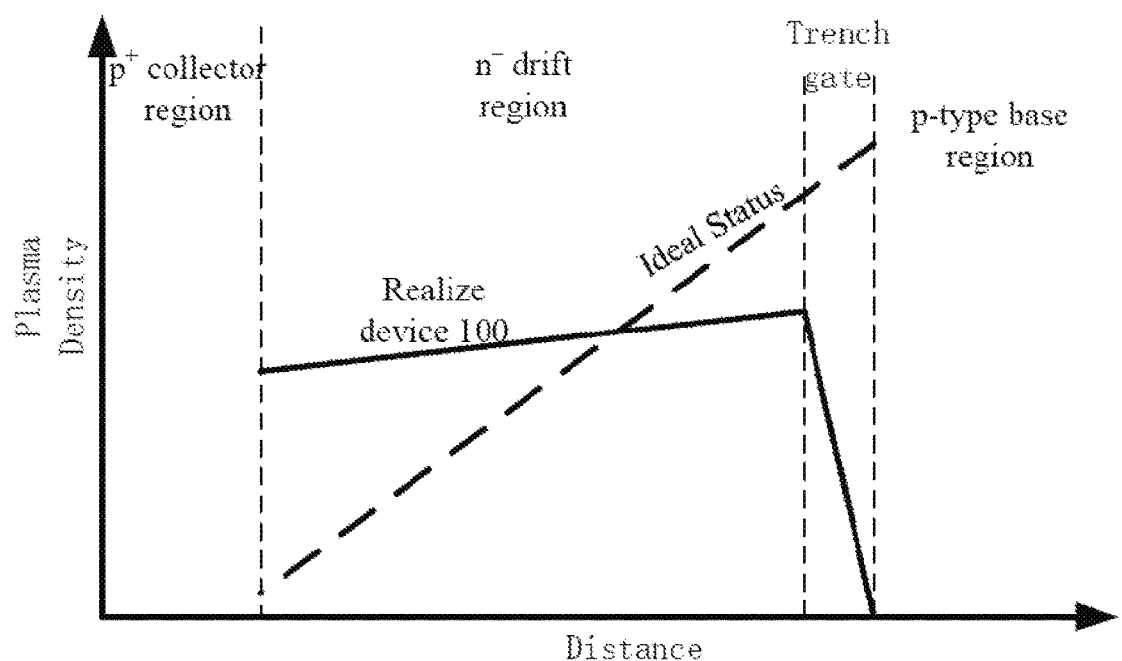
FIG. 2 is an illustration diagram showing a profile curve and an ideal profile curve of on-state electron-hole plasma in a drift region of the device 100.
Figure 3:
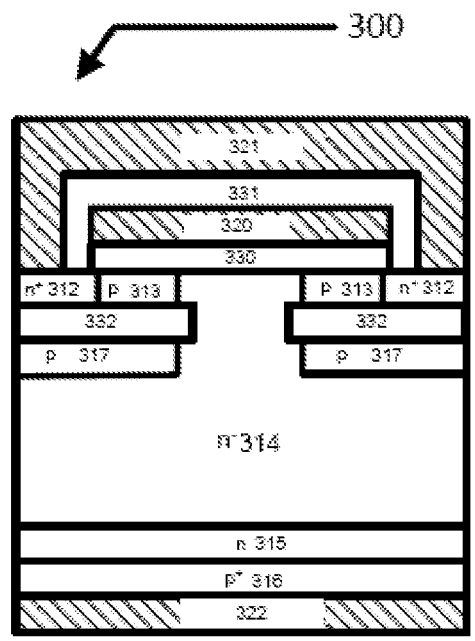
FIG. 3 is a cross-sectional view of the present invention implemented by using an IGBT device 300.
Figure 4:
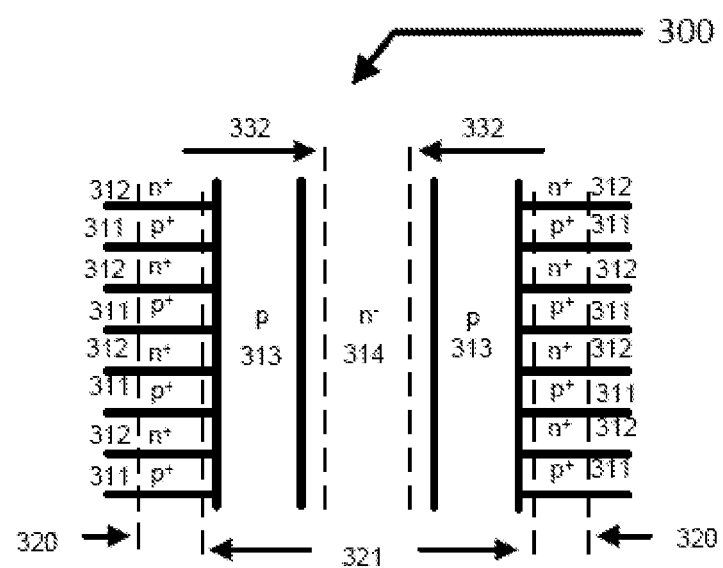
FIG. 4 is a top view of the device 300 shown in FIG. 3.

FIG. 3 is a cross-sectional view of the present invention implemented by using an IGBT device 300. FIG. 4 is a top view of the IGBT device 300. The device 300 includes: a collector electrode (322) located at the bottom; a p$^+$ collector region (316) located on top of the collector electrode (322); an n-type buffer region (315) located on top of the p$^+$ collector region (316); an n$^-$ drift region (314) located on top of the n-type buffer region (315); a p-type floating region (317), where the floating region is partially surrounded by the upper surface of the n$^-$ drift region (314); A buried oxide (332) located on top of the p-type floating region (317); an ultra-thin p-type base region (313) located on top of the buried oxide (332); a p$^+$ contact region (311) adjacent to the p-type base region (313); an n$^+$ emitter region (312) adjacent to the p-type base region (313) and the p$^+$ contact region (311); an emitter electrode (321) connected to both the n$^+$ emitter region (312) and the p$^+$ contact region (311); a gate dielectric (330), where the gate dielectric (330) covers the p-type base region (313), thereby forming an electron channel from the n$^+$ emitter region (312) to the n$^-$ drift region (314); a gate electrode (320) located on top of the gate dielectric (330); and an ILD (331) that isolates the gate electrode (320) from the emitter electrode (321). As shown in FIG. 3 and FIG. 4, the device 300 is a planar IGBT. When a gate-emitter voltage ($V_{GE}$) is zero, the p-base (313)/n$^-$ drift (314) junction can block the current from flowing from the collector electrode (322) to the emitter electrode (321). This keeps the device 300 at off-state. At the off-state of the device, when the collector-emitter voltage ($V_{CE}$) is relatively high, the p-type floating region (317) can protect the p-type base region (313) from being affected by the high electric field in the n$^-$ drift region (314). In addition, at a typical positive high $V_{GE}$ (for example, 15 V), the ultra-thin p-type base region (313) is completely converted into an n$^+$ inversion layer. The n$^+$ inversion layer can conduct electrons from the n$^+$ emitter region (312) to the n$^-$ drift region (314), and therefore, the device is at an on-state. At the on-state of the device, the concentration of electron-hole plasma near the n$^-$ inversion layer can be as high as the concentration of electron-hole plasma in a p-i-n diode. Therefore, the device 300 can implement the theoretically lowest on-state voltage drop. During the turn-off transient of the device, a negative $V_{GE}$ (for example, −15 V) is usually required to provide a hole current path in the p-type base region (313).

Based on the operation mechanism of the device 300, structure parameters need to optimized. As shown in FIG. 3, holes can be injected from the p$^+$ collector region (316) at the on-state of the device 300, which is the same as the case in the device 100. However, if the hole injection efficiency of the p$^+$ collector region (316)/n-type buffer region (315) junction at the back is excessively high, the switching speed will be greatly reduced. Therefore, a doping concentration ranging from $1 \times 10^{18}$ cm$^{-3}$ to $1 \times 10^{21}$ cm$^{-3}$ and a depth ranging from 0.1 μm to 1 μm are preferable for the p$^+$ collector region (316). The doping concentration and the length of the n$^-$ drift region (314) depend on the rated voltage of the device 300. An IGBT generally has a rated voltage ranging from 400 V to 6000 V. Based on the range, the doping concentration of the n$^-$ drift region (314) ranges from $1 \times 10^{12}$ cm$^{-3}$ to $1 \times 10^{15}$ cm$^{-3}$, and the length of the n$^-$ drift region (314) ranges from 30 μm to 400 μm. At the off-state, the p-type floating region (317) should effectively protect the p-type base region (313) from the electric field in the n$^-$ drift region (314). Therefore, the doping concentration of the p-type floating region (317) should be at least ten times greater than the doping concentration of the n$^-$ drift region (314), so as to avoid depletion in the off-state. In another aspect, the p-type floating region (317) should have a small depth, so that at the on-state, there is a wide current path in the n$^-$ drift region (314) near the p-type floating region (317). Preferably, the depth of the p-type floating region (317) ranges from 0.3 μm to 3 μm. At the off-state, the n-type buffer region (315) should stop the expansion of the depletion region. Therefore, the doping concentration of the n-type buffer region (315) should be greater than the doping concentration of the n$^-$ drift region (314). Because the off-state voltage is sustained mainly by the depleted n$^-$ drift region (314), the length of the n-type buffer region (315) can be much shorter than the length of the n$^-$ drift region (314). The function of the buried oxide (332) is electrically separating the p-type floating region (317) from the p-type base region (313). Therefore, thin buried oxide (332) is preferable, so as to reduce processing time and cost during manufacturing. Preferably, the thickness of the buried oxide (332) ranges from 20 nm to 200 nm. To completely isolate the p-type floating region (317) from the p-type base region (313), the p$^+$ contact region (311) and the n$^+$ emitter region (312), the buried oxide (332) should have a width greater than widths of the p-type base region (313), the p$^+$ contact region (311), and the n$^+$ emitter region (312). In addition, to obtain a small cell pitch, neighboring cells should share the buried oxide (332), the p$^+$ contact region (311), and the n$^+$ emitter region (312). Based on the foregoing considerations, the buried oxide (332) is completely surrounded by semiconductor regions composed of the p-type floating region (317), the n$^-$ drift region (314), the p-type base region (313), the p$^+$ contact region (311) and the n$^+$ emitter region (312). At a positive high $V_{GE}$, the p-type base region (313) needs to be completely converted to an n$^+$ inversion layer. The feature can be implemented only by using an ultra-thin silicon layer and a proper doping concentration. An inversion layer generally has a thickness of approximately 10 nm. Therefore, preferably, the thickness of the p-type base region (313) ranges from 5 nm to 20 nm, and the doping concentration of the p-type base region (313) is determined according to the threshold voltage requirement. At a negative high $V_{GE}$ (for example, −15 V), the p$^+$ contact region (311) should connect the accumulated p-type base region (313) to the emitter electrode (321). Therefore, the p$^+$ contact region (311) should be heavily doped, to provide low parasitic resistance. At the on-state, the n$^+$ emitter region (312) should provide electrons to the channel, and the on-state current should flow though the n$^+$ emitter region (312) to reach the emitter electrode (321). Therefore, the n$^+$ emitter region (312) should be heavily doped, to provide low parasitic resistance. Finally, it should be noted that, the width of the p$^+$ contact region (311) and the width of the n$^+$ emitter region (312) are not necessarily the same. By means of design on the width of the n$^+$ emitter region (312), a required saturation current should be provided. For example, in the state-of-the-art IGBTs, the saturation current is approximately 500 A/cm$^2$. Therefore, by means of design on the width of the n$^+$ emitter region (312), a proper electron channel width should be provided, so as to provide a required saturation current. In another aspect, during the switching-off transient of the device, the p$^+$ contact region (311) should be capable of conducting a hole current that is large enough. Therefore, by means of design on the width of the p$^+$ contact region (311), a hole conducting area that is large enough should be provided, so as to safely switch off the device.

FIG. 5 to FIG. 14 show a method for manufacturing the device 300 as shown in FIG. 3 and FIG. 4.

Figure 5:
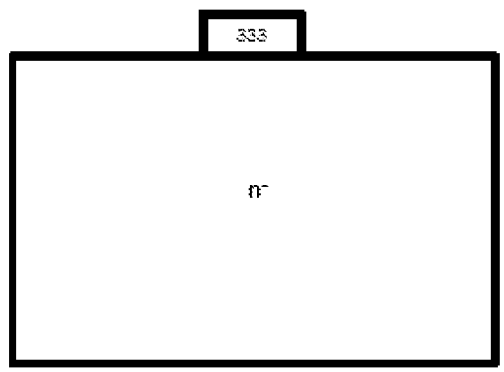
FIG. 5 shows forming of a mask oxide layer (333) on a surface of an initial wafer.

FIG. 5 shows forming of a mask oxide layer (333) on the surface of an initial wafer. The initial wafer is a lightly doped n-type substrate wafer. The doping concentration of the wafer depends on the rated voltage of the device 300. Generally, the doping concentration of the n-type substrate wafer ranges from $1\times10^{12}$ cm$^{-3}$ to $1\times10^{15}$ cm$^{-3}$. An intermediate product, that is, the mask oxide (333), is formed by depositing or thermally growing a silicon dioxide layer and then patterning the silicon dioxide layer.

Figure 6:
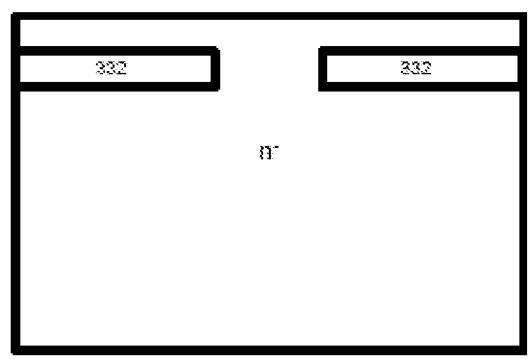
FIG. 6 shows forming of the buried oxide (332)

FIG. 6 shows forming of the buried oxide (332). The buried oxide (332) is made from silicon dioxide. The buried oxide is formed by using a method generally referred to as SIMOX, that is, separation with implanted oxygen. First, oxygen ions are injected by using the patterned oxide (333) as a hard mask. Then, the wafer is annealed at a high temperature (for example, 1300° C.). By means of annealing, buried oxide (332) is formed in the implantation region, and the newly formed buried oxide (332) gradually segregate out silicon around the buried oxide (332). During the segregation process, a top thin silicon region is formed above the buried oxide (332). Finally, the patterned mask oxide (333), that is, the hard mask, on the surface is completely removed by means of wet etching.

Figure 7:
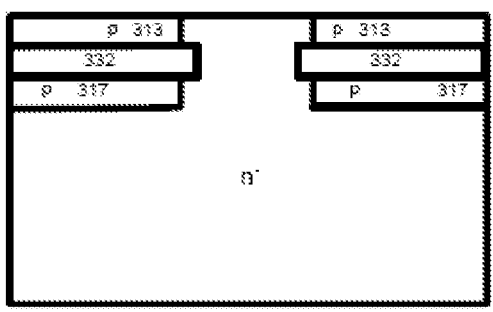
FIG. 7 shows forming of the p-type base region (313) and the p-type floating region (317)

FIG. 7 shows forming of the p-type base region (313) and the p-type floating region (317). First, photolithography is performed to define an implantation region. Then, boron implantation is performed by using the patterned photoresist as a mask. In an embodiment of the present invention, implantation is performed once for forming the p-type base region (313) and the p-type floating region (317). In another embodiment of the present invention, implantation is performed multiple times for forming the p-type base region (313) and the p-type floating region (317), so as to meet different requirements on the concentrations and depths of the two regions. After the implantation, the photoresist is removed. Then, annealing is performed to activate the dopant. Preferably, the annealing is rapid thermal annealing, so as to minimize diffusion of the dopant.

Figure 8:
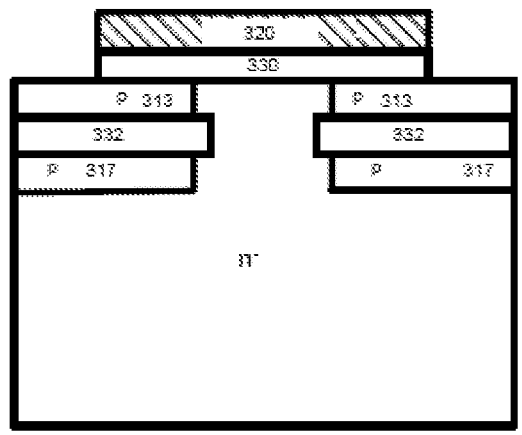
FIG. 8 shows forming of the gate stack.

FIG. 8 shows forming of the gate stack. First, the gate dielectric (330) is formed. In an embodiment of the present invention, the gate dielectric (330) is formed by oxidizing the surface of silicon. This can further reduce the thickness of the p-type base region (313). In another embodiment of the present invention, the gate dielectric (330) is formed by oxidizing the surface of silicon and then depositing a dielectric having a high dielectric constant. This can reduce thermal diffusion in the p-type base region (313), and therefore, impurity concentration distribution is more controllable. After the gate dielectric (330) is formed, polysilicon is deposited and patterned to form the gate electrode (320).

Figure 9:
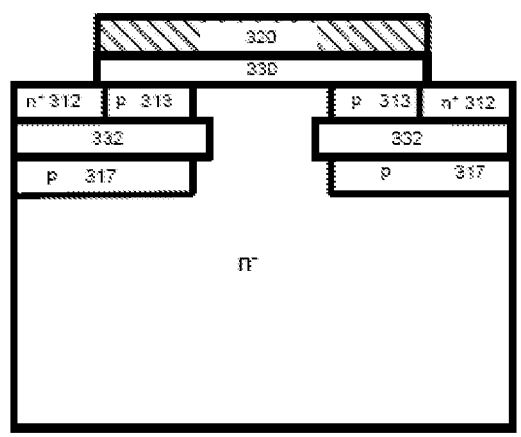
FIG. 9 shows forming of the p+ contact region (311) and n+ emitter region (312)

FIG. 9 shows forming of the p$^+$ contact region (311) and n$^+$ emitter region (312). First, photolithography is performed for the p$^+$ contact region (311). Then, boron implantation is performed by using the patterned photoresist as a mask. Afterward, the photoresist is removed. Then, annealing is performed to activate the boron ions, so as to form the p$^+$ contact region (311). Afterward, photolithography is performed for the n$^+$ emitter region (312). Then, arsenic or phosphorous implantation is performed by using the patterned photoresist as a mask. Afterward, the photoresist is removed. Then, annealing is performed to activate the arsenic ions or phosphorous ions, so as to form the n$^+$ emitter region (312). In another embodiment of the present invention, the foregoing annealing steps can be combined, so as to activate boron ions and arsenic/phosphorous ions ions at the same time.

Figure 10:
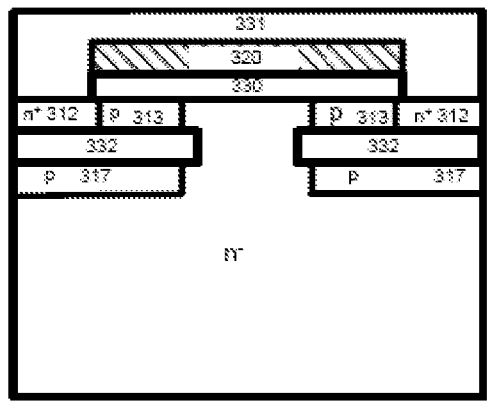
FIG. 10 shows forming of the inter-layer dielectric (ILD) (331)

FIG. 10 shows forming of the ILD (331). Preferably, the ILD (331) is silicon dioxide. The ILD (331) is deposited by means of chemical vapor deposition.

Figure 11:
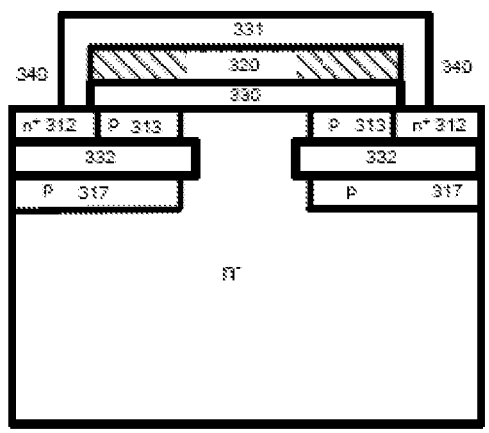
FIG. 11 shows forming of a contact hole (340)

FIG. 11 shows forming of a contact hole (340). The contact hole (340) is formed by patterning the ILD (331).

Figure 12:
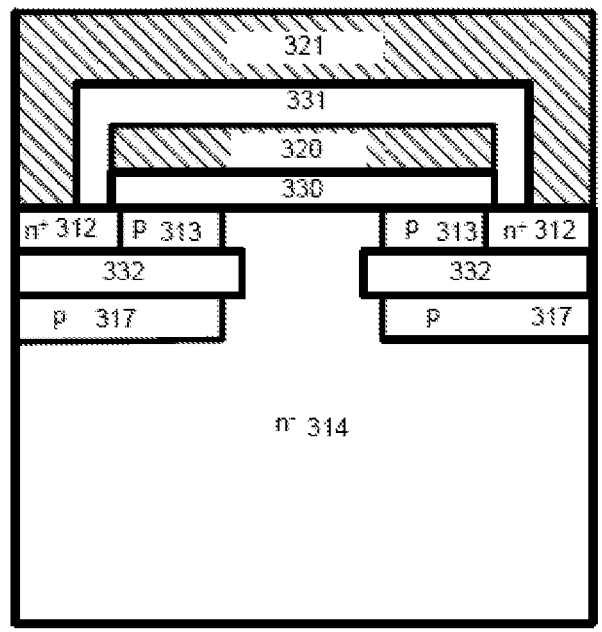
FIG. 12 shows forming of a the emitter electrode (321) and n− drift region (314)

FIG. 12 shows forming of the emitter electrode (321) and n$^-$ drift region (314). First, metal is deposited and the contact hole (340) is filled with the metal. Then, the metal is patterned, so as to form the emitter electrode (321). Afterward, the substrate wafer is thinned from the back surface, so as to form the n$^-$ drift region (314). Generally, the thinning process is first performing mechanical grinding, and then performing chemical etching.

Figure 13:
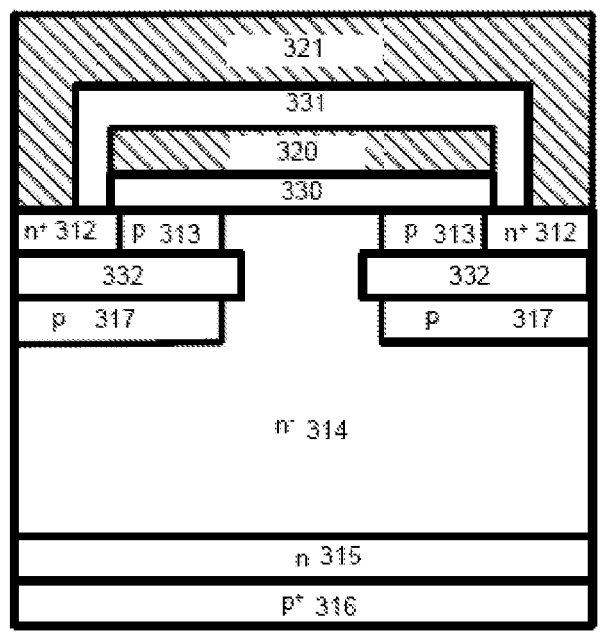
FIG. 13 shows forming of the n-type buffer region (315) and p+ collector region (316)

FIG. 13 shows forming of the n-type buffer region (315) and p$^+$ collector region (316). First, phosphorous ions are implanted into the back surface of the wafer. Then, annealing is performed to activate the implanted phosphorous ions, thereby forming the n-type buffer region (315). Afterward, boron ions are implanted into the back surface of the wafer. Then, annealing is performed to activate the implanted boron ions, thereby forming the p$^+$ collector region (316). Because there is metal on the front surface, annealing is usually performed on the n-type buffer region (315) and the p$^+$ collector region (316) at a low temperature (for example, 480° C.). However, laser annealing can be performed at a high temperature (for example, 1000° C.). In addition, annealing can be performed once to activate the n-type buffer region (315) and the p$^+$ collector region (316) at the same time.

Figure 14:
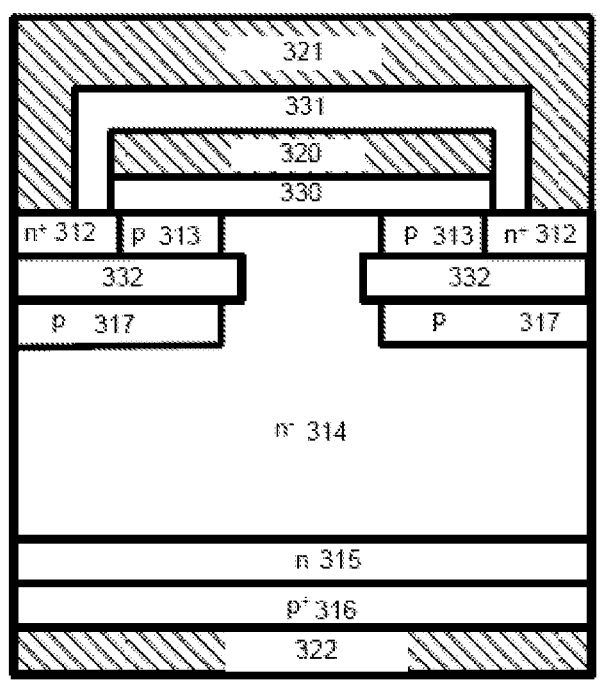
FIG. 14 shows forming of the collector electrode (322).

FIG. 14 shows forming of the collector electrode (322). The collector electrode (322) is formed by depositing a metal layer on the back surface of the wafer. After the metal is deposited, preferably, alloying is performed, so as to reduce contact resistance between the collector electrode (322) and the p$^+$ collector region (316).

Finally, it should be noted that, the order of the steps above can be adjusted according to the manufacturing capability. For example, if ions in the n-type buffer region (315) and the p$^+$ collector region (316) need to be activated completely without using an expensive laser annealing system, the contact hole (340) and the emitter electrode (321) can be formed after the n-type buffer region (315) and the p$^+$ collector region (316) are formed. However, if the contact hole (340) and the emitter electrode (321) are formed after the wafer is thinned, a photolithography system applicable to thin wafers is needed.

What is claimed is:

1. An insulated-gate bipolar transistor (IGBT) structure, comprising:
    a collector electrode located at the bottom;
    a second conductive type collector region located on top of the collector electrode;
    a first conductive type buffer region located on top of the second conductive type collector region;
    a first conductive type drift region located on top of the first conductive type buffer region;
    a second conductive type floating region located on top of the first conductive type drift region;
    a buried oxide on top of the floating region;
    a second conductive type base region, a second conductive type contact region, and a first conductive type emitter region that are located on top of the buried oxide, wherein the contact region and the emitter region are alternately arranged, and the second conductive type base regio is arranged in parallel to the contact region and the emitter region;

an emitter electrode that is located on top of the emitter region and the contact region and that is connected to both the emitter region and the contact region;
a gate dielectric that is located above the second conductive type base region and that covers the surface of the second conductive type base region, thereby forming an electron channel from the emitter region to the drift region;
a gate electrode located on top of the gate dielectric; and
an inter-layer dielectric (ILD) that isolates the gate electrode from the emitter electrode, wherein
the gate dielectric, the floating region, the buried oxide, and the second conductive type base region are all in proximity to the first conductive type drift region;
the buried oxide is completely surrounded by semiconductor regions that are composed of the floating region, the first conductive type drift region, the second conductive type base region, the contact region, and the emitter region.

2. The IGBT structure according to claim 1, wherein the second conductive type collector region has a doping concentration ranging from $1\times10^{18}$ cm$^{-3}$ to $1\times10^{21}$ cm$^{-3}$.

3. The IGBT structure according to claim 1, wherein the second conductive type collector region has a depth ranging from 0.1 μm to 1 μm.

4. The IGBT structure according to claim 1, wherein the first conductive type drift region has a doping concentration ranging from $1\times10^{12}$ cm$^{-3}$ to $1\times10^{15}$ cm$^{-3}$.

5. The IGBT structure according to claim 1, wherein the first conductive type drift region has a length ranging from 30 μm to 400 μm.

6. The IGBT structure according to claim 1, wherein the doping concentration of the second conductive type floating region is at least ten times higher than the doping concentration of the first conductive type drift region.

7. The IGBT structure according to claim 1, wherein the floating region has a depth ranging from 0.3 μm to 3 μm.

8. The IGBT structure according to claim 1, wherein the first conductive type buffer region has a doping concentration higher than the doping concentration of the first conductive type drift region.

9. The IGBT structure according to claim 1, wherein the buried oxide has a thickness ranging from 20 nm to 200 nm.

10. The IGBT structure according to claim 1, wherein the second conductive type base region has a thickness ranging from 5 nm to 20 nm.

11. The IGBT structure according to claim 1, wherein the contact region has a doping concentration ranging from $1\times10^{19}$ cm$^{-3}$ to $1\times10^{21}$ cm$^{-3}$.

12. The IGBT structure according to claim 1, wherein the emitter region has a doping concentration ranging from $1\times10^{19}$ cm$^{-3}$ to $1\times10^{21}$ cm$^{-3}$.

13. A method for manufacturing an insulated-gate bipolar transistor (IGBT) structure, comprising the following steps:
first forming a lightly doped substrate wafer;
forming a patterned oxide layer on a surface of the wafer;
implanting oxygen ions into the wafer by using the patterned oxide layer as a hard mask;
performing annealing at a high temperature to form buried oxide;
removing the hard mask oxide by means of wet etching;
forming a second conductive type base region and a second conductive type floating region on opposing sides of the buried oxide by means of photolithography, implantation, and annealing;
forming a gate dielectric on the second conductive type base region;
forming a gate electrode on the gate dielectric by means of polysilicon deposition and patterning;
forming a second conductive type contact region on the buried oxide by means of photolithography, implantation, and annealing;
forming a first conductive type emitter region on the buried oxide by means of photolithography, implantation, and annealing;
depositing an inter-layer dielectric (ILD);
forming a contact hole by patterning the ILD;
forming an emitter electrode by means of metal deposition and patterning, wherein the emitter electrode is isolated from the gate electrode by the ILD;
thinning the substrate wafer to form a first conductive type drift region;
forming a first conductive type buffer region on the drift region by means of back-surface implantation and annealing;
forming a second conductive type collector region on the buffer region by means of back-surface implantation and annealing; and
forming a collector electrode on the collector region by means of metal deposition on the back and by means of alloying,
wherein the emitter electrode is located on top of the emitter region and the contact region and that is connected to both the emitter region and the contact region; and
the buried oxide is completely surrounded by semiconductor regions that are composed of the floating region, the first conductive type drift region, the second conductive type base region, the contact region, and the emitter region.

14. The manufacturing method according to claim 13, wherein implantation is performed once to form the second conductive type base region and the second conductive type floating region.

15. The manufacturing method according to claim 13, wherein implantation is performed multiple times to form the second conductive type base region and the second conductive type floating region.

16. The manufacturing method according to claim 13, wherein the gate dielectric is formed by oxidizing the surface of the wafer.

17. The manufacturing method according to claim 13, wherein the gate dielectric is formed by oxidizing the surface of the wafer and then depositing a dielectric having a high dielectric constant.

18. A method for manufacturing an insulated-gate bipolar transistor (IGBT) structure, comprising:
first forming a lightly doped substrate wafer;
forming a patterned oxide layer on a surface of the wafer;
implanting oxygen ions into the wafer by using the patterned oxide layer as a hard mask;
performing annealing at a high temperature to form buried oxide;
removing the hard mask oxide by means of wet etching;
forming a second conductive type base region and a second conductive type floating region on opposing sides of the buried oxide by means of photolithography, implantation, and annealing;
forming a gate dielectric on the second conductive type base region;
forming a gate electrode on the gate dielectric by means of polysilicon deposition and patterning;

forming a second conductive type contact region on the buried oxide by means of photolithography, implantation, and annealing;

forming a first conductive type emitter region on the buried oxide by means of photolithography, implantation, and annealing;

depositing an inter-layer dielectric (ILD);

thinning the substrate wafer to form a first conductive type drift region;

forming a first conductive type buffer region on the drift region by means of back-surface implantation and annealing;

forming a second conductive type collector region on the buffer region by means of back-surface implantation and annealing;

forming a contact hole by patterning the ILD;

forming an emitter electrode by means of metal deposition and patterning, wherein the emitter electrode is isolated from the gate electrode by the ILD; and forming a collector electrode by means of metal deposition on the back and by means of alloying, wherein the emitter electrode is located on top of the emitter region and the contact region and that is connected to both the emitter region and the contact region; and the buried oxide is completely surrounded by semiconductor regions that are composed of the floating region, the first conductive type drift region, the second conductive type base region, the contact region, and the emitter region.

* * * * *